(12) United States Patent
Ma

(10) Patent No.: US 9,620,646 B2
(45) Date of Patent: Apr. 11, 2017

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 14/067,109

(22) Filed: Oct. 30, 2013

(65) Prior Publication Data

US 2014/0117371 A1 May 1, 2014

(30) Foreign Application Priority Data

Oct. 31, 2012 (CN) .......................... 2012 1 0429977

(51) Int. Cl.
| | | |
|---|---|---|
| *H01L 21/336* | (2006.01) | |
| *H01L 29/786* | (2006.01) | |
| *H01L 27/12* | (2006.01) | |
| *H01L 29/66* | (2006.01) | |

(52) U.S. Cl.
CPC .......... *H01L 29/786* (2013.01); *H01L 27/124* (2013.01); *H01L 27/1288* (2013.01); *H01L 29/6675* (2013.01); *H01L 2227/323* (2013.01)

(58) Field of Classification Search
CPC ....................... H01L 29/786; H01L 29/66765
USPC ..................................... 438/197, 30
See application file for complete search history.

(56) References Cited

U.S. PATENT DOCUMENTS

| 5,918,130 A | * | 6/1999 | Hause ............... H01L 29/66621 |
| | | | 148/DIG. 100 |
| 2004/0076742 A1 | * | 4/2004 | Chen ................... G02F 1/13454 |
| | | | 427/64 |
| 2005/0077524 A1 | | 4/2005 | Ahn et al. |
| 2006/0269849 A1 | | 11/2006 | Lee |

(Continued)

FOREIGN PATENT DOCUMENTS

| CN | 1869809 A | 11/2006 |
| CN | 101266951 A | 9/2008 |

(Continued)

OTHER PUBLICATIONS

Office Action Rejection Decision (Chinese language) issued by the Chinese Patent Office for Chinese Patent Application No. 201210429977.6 dated Feb. 4, 2015, 7 pages.

(Continued)

*Primary Examiner* — Eric Ward
*Assistant Examiner* — Eric Ashbahian
(74) *Attorney, Agent, or Firm* — Ladas & Parry LLP

(57) ABSTRACT

Embodiments of the present invention relate to an array substrate, a manufacturing method thereof and a display device. The manufacturing method of the array substrate comprises: preparing a base substrate; forming a gate electrode pattern on the base substrate; forming a gate insulating layer pattern on the base substrate with the gate electrode pattern formed thereon; and forming an active layer pattern, a pixel electrode pattern and source and drain patterns above the gate insulating layer pattern through a three-gray-tone mask process in one patterning process, wherein the gate electrode pattern, the active layer pattern, the source pattern and the drain pattern constitute a thin film transistor.

9 Claims, 3 Drawing Sheets

(56) References Cited

U.S. PATENT DOCUMENTS

| | | | | |
|---|---|---|---|---|
| 2007/0246707 | A1* | 10/2007 | Deng | G02F 1/1362 257/57 |
| 2007/0267641 | A1 | 11/2007 | Seo | |
| 2009/0311809 | A1* | 12/2009 | Miyairi | H01L 27/1214 438/22 |
| 2011/0049642 | A1* | 3/2011 | Scheiper | H01L 21/82346 257/392 |
| 2011/0068341 | A1* | 3/2011 | Li | H01L 27/12 257/59 |
| 2011/0157681 | A1* | 6/2011 | Kwon | G02F 1/167 359/296 |
| 2012/0056189 | A1* | 3/2012 | Park | H01L 21/02532 257/72 |
| 2012/0153293 | A1* | 6/2012 | Koyama | G09G 3/3225 257/72 |

FOREIGN PATENT DOCUMENTS

| | | |
|---|---|---|
| CN | 101350330 A | 1/2009 |
| CN | 101587861 A | 11/2009 |
| CN | 101645417 A | 2/2010 |
| CN | 102629569 A | 8/2012 |
| CN | 102651343 A | 8/2012 |
| EP | 1933293 A1 | 6/2008 |

OTHER PUBLICATIONS

English translation of Office Action Rejection Decision issued by the Chinese Patent Office for Chinese Patent Application No. 20120429977.6 dated Jun. 4, 2014, 8 pages.
Second Office Action issued by the Chinese Patent Office for Chinese Patent Application No. 2012104299776 dated Aug. 29, 2014, 6pgs.
English translation of Second Office Action issued by the Chinese Patent Office for Chinese Patent Application No. 2012104299776 dated Aug. 29, 2014, 6pgs.
Extended European Search Report for European Patent Application No. 13190994.7 dated Feb. 14, 2012, 9pgs.
First Office Action issued by the Chinese Patent Office for Chinese Patent Application No. 201210429977.6 dated Jun. 4, 2014, 5pgs.
English translation of First Office Action issued by the Chinese Patent Office for Chinese Patent Application No. 201210429977.6 dated Jun. 4, 2014, 4pgs.
Third Office Action issued by the Chinese Patent Office for Chinese Patent Application No. 2012104299776 dated Dec. 11, 2014, 9pgs.
English translation of Third Office Action issued by the Chinese Patent Office for Chinese Patent Application No. 2012104299776 dated Dec. 11, 2014, 8pgs.
English Abstract of CN102629569A; 1 page.
Chinese Patent Certificate Appln. No. ZL 2012 1 0429977.6; Dated Oct. 31, 2012.

* cited by examiner

ARRAY SUBSTRATE, MANUFACTURING METHOD THEREOF AND DISPLAY DEVICE

CROSS REFERENCE TO RELATED APPLICATIONS

This application claims priority from Chinese National Application No. 201210429977.6 filed on Oct. 31, 2012, the contents of which are incorporated herein by reference.

TECHNICAL FIELD

Embodiments of the present invention relate to an array substrate, a manufacturing method thereof and a display device.

BACKGROUND

Thin film transistors (TFT) can be divided into a polysilicon (P-Si) TFT and an amorphous silicon (a-Si) TFT, and the difference between the two lies in different transistor characteristics. As the a-Si per se has characteristics of low on-state current (Ion), low mobility and poor stability, its applications in many fields are restricted. An electron mobility of the P-Si is faster than that of the a-Si with a disorder arrangement by 200-300 times. P-Si products mainly comprise a high temperature polysilicon (HTPS) product and a lower temperature polysilicon (LTPS) product.

An LTPS technology is a new generation of TFT display fabrication technology, by which an a-Si thin film layer is transferred to a P-Si thin film layer using an excimer laser anneal (ELA), a metal induced crystallization (MIC) or a solid phase crystallization (SPC). An LTPS TFT display has a faster response time and a higher resolution and thus has a better image display quality. Using the LTPS technology during forming a peripheral circuit of a display device can reduce the number of integrated circuits (IC), simplify a periphery of the display device and thus, a narrow frame technology is achieved.

A traditional LTPS TFT array substrate comprises: a glass substrate, a buffer layer, a channel region, a gate insulating layer, a gate electrode, a source/drain electrode, an interlayer insulating layer, a passivation layer, a pixel electrode layer and a pixel electrode insulating protective layer (PDL) (this layer is applicable to an LTPS Active Matrix/Organic Light Emitting Diode (AMOLED), while an LTPS liquid crystal display (LCD) may not have this layer). The fabricating process of the traditional LTPS TFT array substrate is a 7-Mask process, specifically comprising:

The first mask process: forming a polysilicon of a source/drain region and a channel region of a TFT.

First, a buffer layer of $SiNx/SiO_2$ is formed on a glass substrate, then a layer of an a-Si thin film is deposited on the buffer layer, and the a-Si thin film is transformed into a P-Si thin film through an LIPS crystallization manner (such as, ELA, MIC and SPC). Then, a layer of photoresist is coated on the P-Si thin film, exposing, developing, etching, removing of the photoresist are performed by using a first mask, and thus, a channel region pattern is formed.

The second mask process: forming a gate electrode and a gate line pattern.

A gate insulating layer and a gate metal layer thin film are deposited on patterns formed by the first mask process, and the gate insulating layer thin film can be formed of $SiNx/SiO_2$. Then a photoresist is coated on the gate metal layer thin film, and exposing, developing, etching, removing of the photoresist are performed by using a second mask, and thus, the gate electrode and the gate line pattern are formed.

Based on patterns formed by the second mask process, an ion doping to the source/drain region of the P-Si is performed by using the gate electrode above the channel region as a barrier layer. An ion doped region is formed at the source/drain region after the ion doping, after the ion doping ends, crystal lattices of the P-Si regularly crystallized are destroyed by the ion doping, in order to restore the crystal lattices of the P-Si, a annealing treatment is also needed and serves to reform the crystal lattices of the P-Si on the one hand and to diffuse doped ions on the other hand.

The third mask process: forming contact holes used to connect the P-Si in the source/drain region and a source/drain electrode.

A layer of interlayer insulating layer thin film is formed on patterns obtained after the above processes, and then, a layer of photoresist is coated on the interlayer insulating layer thin film, and exposing, developing, etching, removing of the photoresist are performed by using a third mask to form the contact holes.

The fourth mask process: forming the source/drain electrode and a data line pattern.

On patterns formed by the third mask process, a source/drain metal layer thin film is deposited, then the photoresist is coated on the source/drain metal layer thin film, and exposing, developing, etching, removing of the photoresist are performed by using a fourth mask to form the source/drain electrode and the data line pattern.

The fifth mask process: forming a through hole exposing a part of the source/drain electrode.

On patterns formed by the fourth mask process, a passivation layer thin film is deposited, and then a photoresist is coated exposing, developing, etching, removing of the photoresist are performed by using a fifth mask to form the through hole.

The sixth mask process: on patterns formed by the fifth mask process, a pixel electrode layer thin film is deposited, and then a photoresist is coated, exposing, developing, etching, removing of the photoresist are performed by using a sixth mask to form a pixel electrode pattern.

The seventh mask process: on patterns formed by the sixth mask process, a layer of protective layer thin film is deposited, and then a photoresist is coated, exposing, developing, etching, removing of the photoresist are performed by using a seventh mask to form a pixel edge protective layer pattern. This mask process is applicable to the LTPS AMOLED, and may not be used for the LTPS LCD.

The traditional technology for fabricating the LTPS thin film transistor (TFT) array substrate by using the 7-Mask process has a complex fabricating process and relatively more fabricating flows, and the fabricating cost is caused to be increased.

SUMMARY

Embodiments of the present invention provide an array substrate, a manufacturing method thereof and a display device comprising the array substrate and can simplify the fabricating process of the array substrate, and then lower the production cost and improve the product quality of the array substrate.

An embodiment of the present invention provides a manufacturing method of the array substrate, comprising: preparing a base substrate; forming a gate electrode pattern on the base substrate; forming a gate insulating layer pattern on the base substrate with the gate electrode pattern formed thereon; and forming an active layer pattern, a pixel electrode pattern and source and drain patterns above the gate insulating layer pattern through a three-gray-tone mask process in one patterning process, wherein the gate electrode pattern, the active layer pattern, the source pattern and the drain pattern constitute a thin film transistor.

An embodiment of the present invention also provides an array substrate, comprising: a base substrate; a gate electrode pattern on the base substrate; a gate insulating layer pattern above the gate electrode pattern; an active layer pattern above the gate insulating layer pattern; a pixel electrode pattern above the active layer pattern; source and drain patterns above the pixel electrode pattern, wherein, the gate electrode pattern, the active layer pattern, the source pattern and the drain pattern constitute a thin film transistor, the pixel electrode pattern is formed from a pixel electrode layer thin film, the active layer pattern is formed from an active layer thin film, and the source pattern, the drain pattern, the pixel electrode pattern and the active layer pattern are formed by using one patterning process.

In addition, an embodiment of the present invention also provides a display device, comprising: the array substrate as described above and a counter substrate cell-assembled with the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
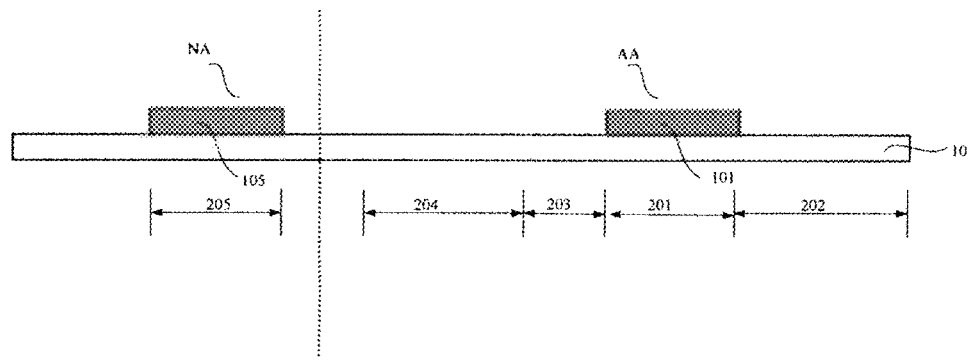
FIGS. 1-9 are schematic cross-sectional views of an array substrate obtained in various steps in a manufacturing method of an array substrate according to an embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

A manufacturing method of an array substrate according to the first embodiment of the present invention comprises: preparing a base substrate; forming a gate electrode pattern on the base substrate; forming a gate insulating layer pattern on the base substrate with the gate electrode pattern formed thereon; and forming an active layer pattern, a pixel electrode pattern and source and drain patterns above the gate insulating layer pattern through a three-gray-tone mask process in one patterning process, wherein the gate electrode pattern, the active layer pattern, the source pattern and the drain pattern constitute a thin film transistor.

Forming the source pattern, the drain pattern, the pixel electrode pattern and the active layer pattern through the three-gray-tone mask process in the one patterning process can reduce the number of mask, simplify the production process and greatly lower the production cost.

Exemplarily, forming the active layer pattern, the pixel electrode pattern and the source and drain patterns above the gate insulating layer pattern through the three-gray-tone mask process in the one patterning process comprises:

sequentially forming an active layer thin film, a pixel electrode layer thin film and a source/drain metal layer thin film, wherein, the active layer thin film comprises a source region corresponding to the source pattern, a drain region corresponding to the drain pattern, and a channel region used to form a channel of the thin film transistor;

forming a photoresist with a first thickness, a second thickness and a third thickness above the source/drain metal layer thin film by using the three-gray-tone mask process, the photoresist with the first thickness being located above the channel region, the photoresist with the second thickness being located above a region where the pixel electrode pattern is located, and the photoresist with the third thickness being located above the source region and the drain region, wherein, the first thickness is smaller than the second thickness, and the second thickness is smaller than the third thickness; and etching away the active layer thin film, the pixel electrode layer thin film and the source/drain metal layer thin film in a region without the photoresist to form the active layer pattern, etching away the pixel electrode layer thin film and the source/drain metal layer thin film above the channel region to form the channel region, etching away the source/drain metal layer thin film in a region where the photoresist with the second thickness is located to form the pixel electrode pattern, and removing the photoresist above the source region and the drain region to form the source pattern and the drain pattern.

Wherein, the photoresists with the first, the second and the third thicknesses are formed by exposing using a three-gray-tone mask.

Exemplarily, the manufacturing method of the array substrate according to the embodiment of the present invention will be detailed hereinafter in combination with FIGS. 1-9, and the manufacturing method comprises following steps:

S1, Forming a gate electrode pattern on a base substrate.

Exemplarily, as shown in FIG. 1, a metal layer thin film (not shown in the drawing) is first formed on a surface of a base substrate 10. Wherein, the base substrate 10 is usually a glass substrate or a quartz substrate, and comprises a display region AA and a lead wire region NA, the display region comprises a source predetermined region 202, a drain predetermined region 203, a channel predetermined region 201 and a pixel electrode predetermined region 204, and the lead wire region comprises a lead wire predetermined region 205. In this embodiment, a sputtering process can be used to deposit the metal layer thin film on the base substrate 10, and the metal layer thin film can be a W layer, a Cr layer or other performive metal layer thin film.

Then, the metal layer thin film is formed as the gate electrode pattern 101 through one patterning process. Exemplarily, a photoresist (not shown in the drawing) is coated on the metal layer thin film, a gate electrode mask is used to perform a first exposing, a developing treatment is then performed, and by using an etching, the gate electrode pattern 101 is formed, for example, a wet etching process is used to etch the metal layer thin film to form the gate electrode pattern 101, and then removing the photoresist. Wherein, the gate electrode pattern 101 is located in the channel predetermined region 201.

It should be noted that, during forming the gate electrode pattern 101 in the display region AA, the gate line lead wire 105 is also formed in the lead wire predetermined region 205 of the lead wire region NA at the same layer with the gate electrode pattern 101. In addition, what is formed at the same layer with the gate electrode pattern 101 can also be a common electrode pattern. Alternatively, the common electrode pattern may be formed at the same layer with a source pattern 102 and a drain pattern 103.

S2, Forming a gate insulating layer pattern above the gate electrode pattern.

Figure 2:
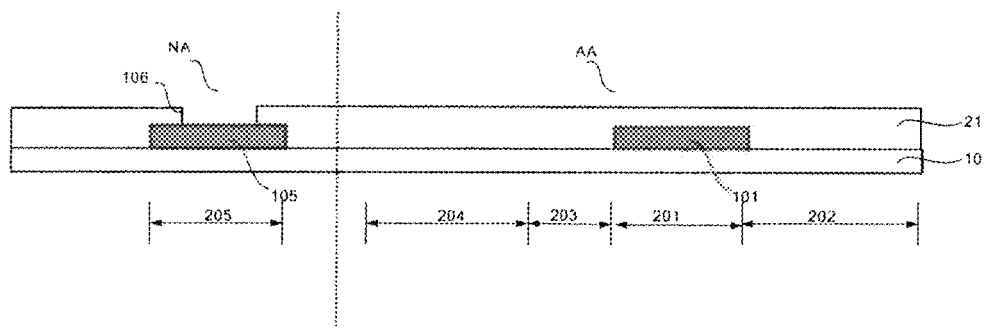

Exemplarily, as shown in FIG. 2, a layer of dielectric layer thin film (not shown in the drawing) is formed above the base substrate 10 with the gate electrode pattern 101 formed thereon, for example, the dielectric layer thin film can be deposited on the gate electrode pattern 101 through a chemical vapor deposition process. Wherein, the dielectric layer thin film can be a silicon nitride dielectric layer thin film, a silicon oxide dielectric layer thin film or a composite dielectric layer thin film of silicon nitride and silicon oxide.

Then, the dielectric layer thin film is formed as the gate insulating layer pattern 21 through one patterning process. Exemplarily, the gate insulating layer pattern 21 is formed through coating a photoresist, exposing, developing of the photoresist, etching, for example, a dry etching process, and removing the photoresist.

Wherein, at the lead wire predetermined region 205 of the lead wire region NA, there is formed a connection through hole 106 exposing the gate line lead wire 105 in the gate insulating layer pattern 21, and the gate insulating layer pattern 21 completely covers the display region AA.

S3, Sequentially forming an active layer pattern, a pixel electrode pattern and source and drain patterns above the gate insulating layer pattern.

Exemplarily, a description is made by taking as an example that an active layer is a P-Si layer. The embodiment of the present invention can be applied to prepare a LTPS TFT array substrate, but is not limited to this, for example, if the embodiment of the present invention can be used to manufacture an a-Si TFT array substrate, a crystallization process, an ion doping process and an annealing process of the P-Si layer may be omitted.

Figure 3:
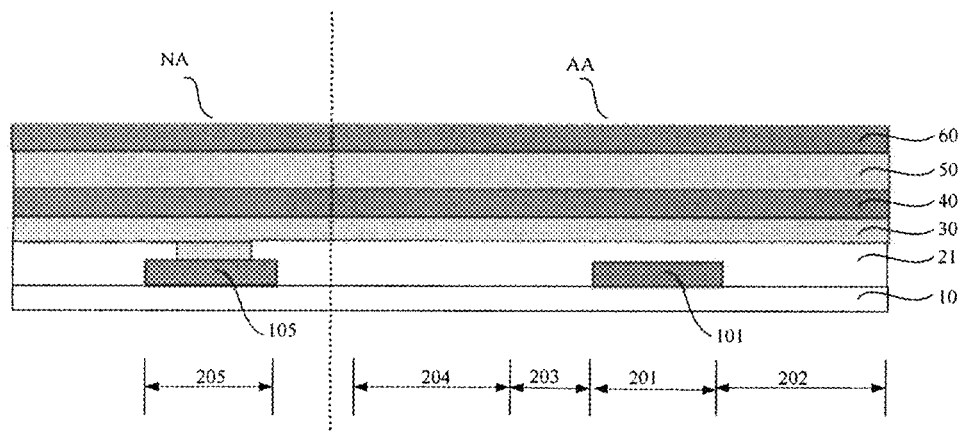

As shown in FIG. 3, a P-Si layer thin film 30, a pixel electrode layer thin film 40 and a source/drain metal layer thin film 50 are sequentially formed on the gate insulating layer pattern 21.

Exemplarily, the following is contained:

First, an a-Si layer thin film (not shown in the drawing) is deposited on the gate insulating layer pattern 21, and then is transformed to a P-Si layer thin film 30 (p-Si layer) through process methods such as an excimer laser annealing (ELA), a metal induced crystallization (MIC) or a solid phase crystallization (SPC). Exemplarily, a description is made by taking as an example that the a-Si layer thin film is transformed to the P-Si layer thin film 30 through the ELA. During the ELA, the a-Si layer thin film is quickly fused and re-crystallized by absorbing a far ultraviolet laser, so that the base substrate 10 can be kept in low temperature state and thus, is not affected. During a practical process, various parameters in a process of depositing the a-Si layer thin film need to be controlled strictly, for example, a hydrogen content of the a-Si layer thin film may be lowered through a hydrogenation treatment, so as to form the a-Si layer thin film with low hydrogen content, high uniformity of film thickness and low surface roughness.

Secondly, after forming the P-Si layer thin film 30, an ion doping is performed to the whole P-Si layer thin film 30, and exemplarily, a P type doping or a N type doping can be performed to the whole P-Si layer thin film 30. Herein, the P-Si layer thin film 30 comprises a source region, a drain region and a channel region, and the source region is above the source predetermined region 202, the drain region is above the drain predetermined region 203, and the channel region is above the channel predetermined region 201. Subsequently, the pixel electrode layer thin film 40 and the source/drain metal layer thin film 50 are sequentially deposited above the P-Si layer thin film 30, and exemplarily, the pixel electrode layer thin film 40 is located between the P-Si layer thin film 30 and the source/drain metal layer thin film 50. Wherein, the pixel electrode layer thin film 40 comprises a pixel electrode region located above the pixel electrode predetermined region 204.

Furthermore, in this embodiment, the pixel electrode pattern, the source pattern, the drain pattern and the active layer pattern are formed through one patterning process, and the patterning process will be detailed hereinafter in combination with FIGS. 3-8.

Figure 4:
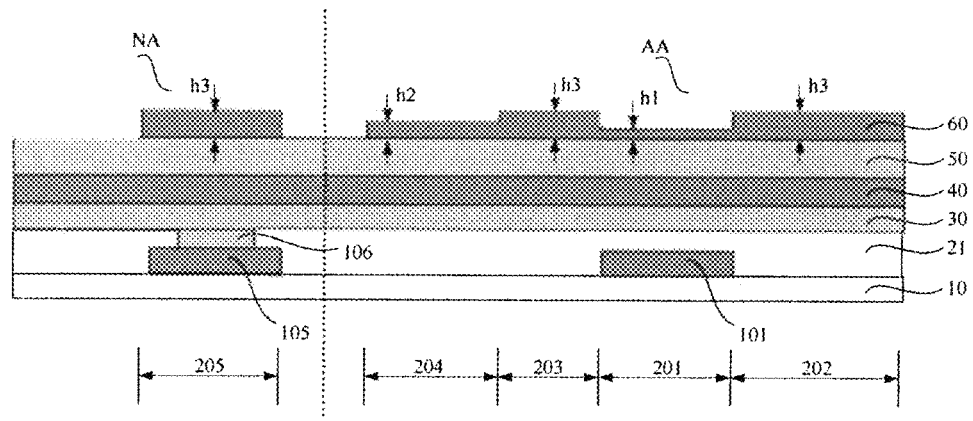

First, as shown in FIG. 3, a layer of photoresist 60 is coated on the source/drain metal layer thin film 50. As shown in FIG. 4, the photoresist 60 with a first thickness h1, a second thickness h2 and a third thickness h3 is formed above the source/drain metal layer thin film 50 after exposing and developing using a multi-gray-tone mask, wherein, the first thickness h1 is smaller than the second thickness h2, the second thickness h2 is smaller than the third thickness h3, and the photoresist with the first thickness h1 is above the channel predetermined region 201, the photoresist with the second thickness h2 is above the pixel electrode predetermined region 204, the photoresist with the third thickness h3 is above the source predetermined region 202, the drain predetermined region 203 and a data line region (not shown herein), and a remaining photoresist is completely removed. It needs to be indicated that, in this embodiment, in the lead wire predetermined region 205 of the lead wire region NA, a thickness of the photoresist is also the third thickness h3.

Figure 5:
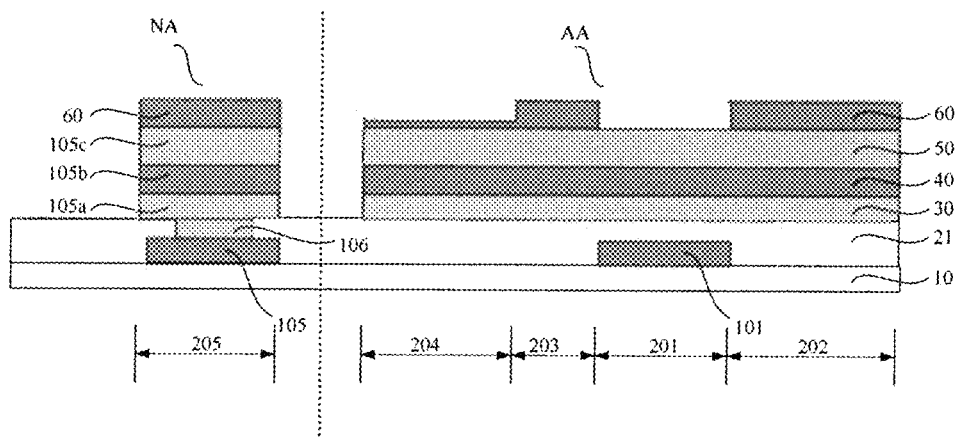

Then, a first etching process is performed to form the active layer pattern. Exemplarily, as shown in FIG. 5, the source/drain metal layer thin film 50 in a region without the photoresist is etched away by using, for example, a wet etching process, and then the pixel electrode layer thin film 40 and the P-Si layer thin film 30 below the source/drain metal layer thin film 50 are further etched away by using, for example, a dry etching process (gas dry etching). After the dry etching process, the source/drain metal layer thin film 50, the pixel electrode layer thin film 40 and the P-Si layer thin film 30 in the region without the photoresist are all etched away so as to form the active layer pattern. Meanwhile, the dry etching process can also thin the photoresist above the pixel electrode predetermined region 204 and the channel predetermined region 201. Thus, by way of controlling etching process parameters and the first thickness h1 of the photoresist, it is achieved that the photoresist above the channel predetermined region 201 is just completely removed after the dry etching process. However, in a practical process, there is usually residual photoresist retained above the channel predetermined region 201, and an ashing treatment is needed to remove the residual photoresist.

Figure 6:
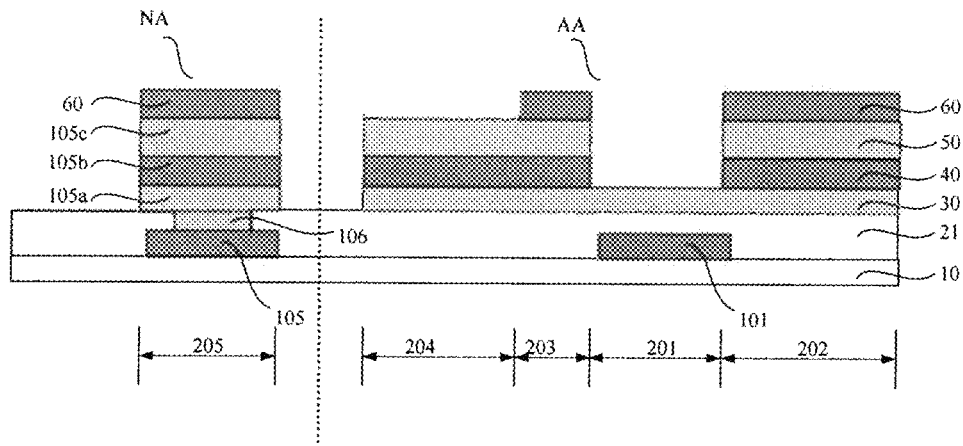

Furthermore, as shown in FIG. 6, a second etching process is performed to form the channel region. First, the source/drain metal layer thin film 50 above the channel predetermined region 201 is etched away by using, for example, a wet etching treatment, and then the pixel electrode layer thin film 40 above the channel predetermined region 201 is further etched away by using, for example, a dry etching treatment. Meanwhile, the dry etching treatment can also thin the photoresist above the pixel electrode predetermined region 204. By way of controlling etching process parameters and the second thickness h2 of the photoresist, it is achieved that the photoresist above the pixel electrode predetermined region 204 is just completely removed after the dry etching treatment. However, in a practical process, there is usually residual photoresist retained above the pixel electrode predetermined region 204, and an ashing treatment is needed to remove the residual photoresist.

Figure 7:
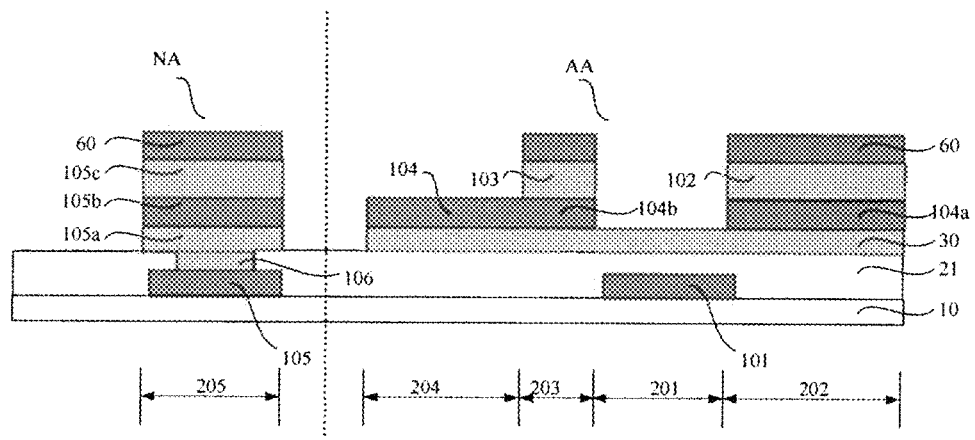

Further, as shown in FIG. 7, a third etching process is performed to form the pixel electrode pattern 104. To form a transparent pixel electrode pattern 104, a material of the pixel electrode layer thin film 40 can be a transparent conductive material, for example, indium tin oxide. While the source/drain metal layer thin film 50 can be a W layer, a Cr layer or other conductive metal layer. Exemplarily, the source/drain metal layer thin film 50 above the pixel electrode predetermined region 204 is etched away by using, for example, a wet etching process so as to form the pixel electrode pattern 104.

It needs to be indicated that, in view of the process, the pixel electrode layer thin film 104a above the source predetermined region 202 and the pixel electrode layer thin film 104b above the drain predetermined region 203 are retained. As the pixel electrode layer thin film is a conductive thin film, a conductivity of the source/drain electrode formed above it will not be affected. Likewise, in view of the process, in the pixel electrode predetermined region 204, the P-Si layer thin film 30 below the pixel electrode pattern 104 is also retained, as the P-Si layer thin film 30 is formed of an inorganic material with a excellent light transmission property, the P-Si layer thin film 30 retained in the pixel electrode predetermined region 204 will not affect a light transmission property of pixel electrode.

Figure 8:
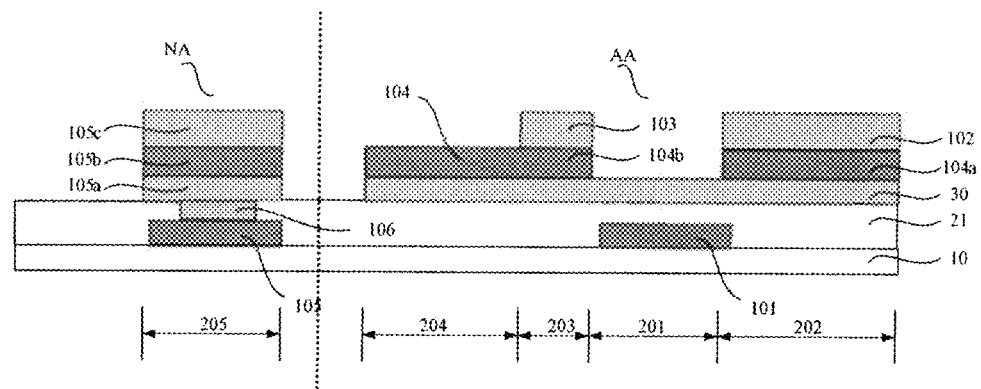

Finally, as shown in FIG. 8, the photoresist retained above the source predetermined region 202 and the drain predetermined region 203 is removed to form the source pattern 102 and the drain pattern 103. Exemplarily, after the third etching process ends, the photoresist on the source/drain metal layer thin film 50 is removed, and then the source pattern 102 and the drain pattern 103 are formed.

It needs to be indicated that, in the lead wire predetermined region 205 of the lead wire region NA, as a thickness of the photoresist formed above it and a thickness of the photoresist formed above the source predetermined region 202 and the drain predetermined region 203 are both h3, the P-Si layer thin film, the pixel electrode layer thin film and the source/drain metal layer thin film formed in the connection through hole 106 are not etched away, and are respectively retained as a first connecting electrode 105a, a second connecting electrode 105b and a third connecting electrode 105c connected to the gate line lead wire 105. Herein, the first connecting electrode 105a is formed of the P-Si layer thin film 30, the second connecting electrode 105b is formed of the pixel electrode layer thin film 40, the third connecting electrode 105c is formed of the source/drain metal layer thin film 50, which are all formed of conductive material and can serve as connecting electrodes.

Therefore, the active layer pattern, the source pattern, the drain pattern and the pixel electrode pattern are formed by one patterning process using the three-gray-tone mask process, and the fabrication process is greatly simplified and the production cost is lowered.

Exemplarily, in this embodiment, the photoresist with the first thickness h1, the second thickness h2 and the third thickness h3 are formed by exposing using a three-gray-tone mask. Herein, the three-gray-tone mask has four portions, i.e., a first portion, a second portion, a third portion and a fourth portion, wherein, the fourth portion is a complete transparent region, the first portion and the second portion are non-complete transparent regions, the light transmittance of the first portion is larger than that of the second portion, and the third portion is an opaque region.

After exposing and developing are performed by using the three-gray-tone mask, the photoresist with the first thickness h1 is formed to correspond to the first portion, the photoresist with the second thickness h2 is formed to correspond to the second portion, the photoresist with the third thickness h3 is formed to correspond to the third portion, and a photoresist-completely-removed region corresponding to the fourth portion is formed. For example, as shown in FIG. 4, a depth of exposed photoresist corresponding to the first portion can be 60% of the thickness of the photoresist, a depth of exposed photoresist corresponding to the second portion can be 30% of the thickness of the photoresist, a depth of exposed photoresist corresponding to the third portion can be 0% of the thickness of the photoresist, that is, the photoresist corresponding to the third portion is not exposed, and a depth of exposed photoresist corresponding to the fourth portion can be 100% of the thickness of the photoresist, that is, the photoresist is complete exposed. It needs to be indicated that herein description is made with an example which is not limitative, and a practical depth of exposed photoresist can be designed according to specific process requirements.

Furthermore, in the manufacturing method of the array substrate according to the embodiment, after the pixel electrode pattern 104, a counter doping may be performed to the channel region of the P-Si layer thin film 30 by using the source pattern 102 and the drain pattern 103 as barrier layers. Exemplarily, if a P type doping is performed to the whole P-Si layer thin film 30, here a N type doping may be performed to the channel region of the P-Si layer thin film 30, on the contrary, if the N type doping is performed to the whole P-Si layer thin film 30, the P type doping may be performed to the channel region of the P-Si layer thin film 30, so as to form a MOS structure.

Furthermore, the manufacturing method of the array substrate according to the embodiment of the present invention can also comprise following steps:

S4, forming a passivation layer pattern above on the base substrate with the thin film transistor and the pixel electrode pattern formed thereon.

Figure 9:
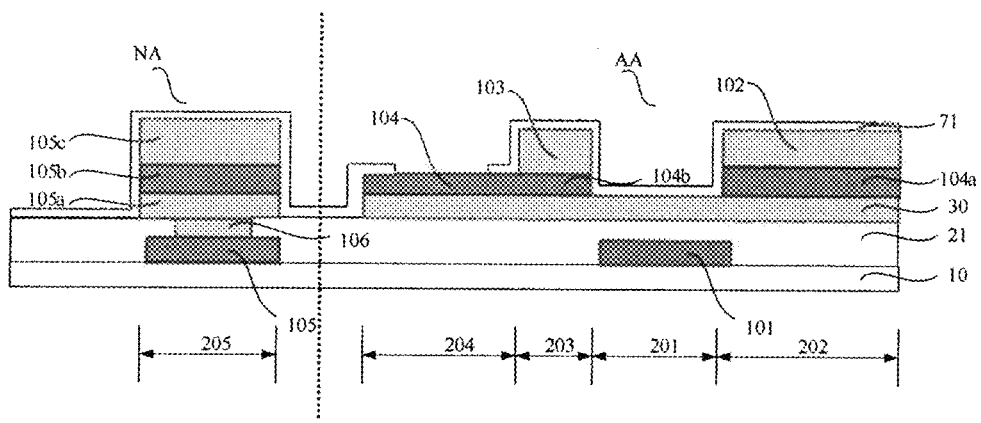

As shown in FIG. 9, the passivation layer pattern 71 is formed on the base substrate 10 with the pixel electrode pattern 104, the source pattern 102, the drain pattern 103 and the channel region pattern formed thereon, for example, the S4 can comprise:

First, a passivation layer thin film (not shown in the drawing) is formed on the base substrate 10 obtained after the above steps, wherein, a material of the passivation layer thin film can be an inorganic material, an organic material, or a mixture of an inorganic material and an organic material.

Then, the passivation layer pattern 71 is formed from the passivation layer thin film through a patterning process, comprising: coating a photoresist (now shown in the drawing) on the passivation layer thin film, performing exposing, developing and etching process with a mask, for example, the passivation layer thin film above the pixel electrode predetermined region 204 may be etched away by using, for example, a dry etching method, so that the pixel electrode pattern 104 is exposed; finally, the photoresist on the passivation layer thin film is removed to form the passivation layer pattern 71.

It needs to be indicated that, as shown in FIG. 9, the passivation layer pattern 71 also covers the third connecting electrode 105c in the lead wire predetermined region 205, and has a through hole formed therein (not shown in the drawing) so that the first connecting electrode 105a, the second connecting electrode 105b and the third connecting electrode 105c below it can connect the gate line lead wire 105 and the peripheral circuit. Correspondingly, at a region where the data line is connected to the peripheral circuit, the passivation layer pattern 71 is also formed with a through hole (not shown in the drawing) therein for connecting the data line and the peripheral circuit. In addition, as shown in FIG. 9, the passivation layer pattern 71 can also cover an edge of the pixel electrode pattern 104 in the pixel electrode predetermined region 204, and thus, when the array substrate is used for an OLED, it can prevent the pixel electrode pattern 104 from piercing an organic layer, in turn, a short circuit of cathode and anode caused by the piercing can be avoided, and the passivation layer pattern 71 has a function of a protective layer (i.e., a PDL layer) in a traditional 7-Mask process, and also has a function of protecting the source/drain electrode pattern, thereby, one patterning process for forming the PDL layer can be omitted, and the fabrication process is further simplified and the production cost is further lowered.

After forming the passivation layer thin film on the base substrate 10 and before forming the passivation layer pattern 71, an annealing treatment may be performed to the P-Si layer thin film 30 to activate doped ions in the source region and the drain region and to reform the crystal lattices of the P-Si. Exemplarily, the annealing treatment is performed through a high temperature treatment.

It needs to be indicated that the manufacturing method of the array substrate according to the present embodiment is described for a bottom gate type TFT array substrate, wherein, the pixel electrode pattern, the source pattern, the drain pattern and the active layer pattern are formed with one patterning process, and but, a forming order of various structure layers is not limited in an embodiment of the present invention, and one skilled in the art can conceive other simple variations and adjustments, for example, the manufacturing method can be used to form a top gate type TFT array substrate, and thus, correspondingly, a forming order of various structure layers, the gate insulating layer pattern, the passivation layer pattern, the lead wire region and the like should adjusted adaptively, which shall fall within the protection scope of the embodiment of the present invention.

From the above embodiment, in the array substrate and the manufacturing method thereof provided by the embodiment of the present invention, the pixel electrode pattern, the source pattern, the drain pattern and the active layer pattern (the present embodiment takes an example that the active layer is a P-Si layer) are formed with one patterning process, and compared with the traditional 7-Mask fabrication process, the process becomes more simpler, the production period is shorten, the product cost is lower and the product quality is improved.

A Second Embodiment

The present embodiment provides an array substrate which comprises a thin film transistor and a pixel electrode pattern formed on a base substrate, and the thin film transistor at least comprises a gate electrode pattern, an active layer pattern, a source pattern and a drain pattern, and the source pattern, the drain pattern, the pixel electrode pattern and the active layer pattern are formed with one patterning process.

Exemplarily, the array substrate comprises: a base substrate; a gate electrode pattern on the base substrate; a gate insulating layer pattern above the gate electrode pattern; an active layer pattern above the gate insulating layer pattern, which is formed of an active layer thin film formed above the gate insulating layer pattern and comprises a source region, a drain region and a channel region; a pixel electrode pattern above the active layer pattern, which is formed of a pixel electrode layer thin film formed above the active layer pattern and comprises a pixel electrode region; source and drain patterns above the pixel electrode pattern, which are formed of a source/drain metal layer thin film formed above the pixel electrode pattern.

Exemplarily, the array substrate can further comprise:
a passivation layer pattern above the source and drain patterns.

Furthermore, the passivation layer pattern can further cover an edge of the pixel electrode pattern.

Furthermore, in the array substrate, the pixel electrode layer thin film directly below the source pattern and the drain pattern is retained, and there is the retained active layer thin film directly below the pixel electrode pattern.

Furthermore, the array substrate comprises a display region and a lead wire region, and the display region comprises gate lines disposed at the same layer with the gate electrode pattern and data lines, and a gate line lead wire and a data line lead wire are provided within the lead wire region for respectively connecting the gate lines and the data lines to a peripheral circuit, wherein, the gate insulating layer pattern comprises a through hole formed on the gate line lead wire, and a first connecting electrode formed from the active layer thin film, a second connecting electrode formed from the pixel electrode layer thin film and a third connecting electrode formed from the source/drain metal layer thin film are formed in the through hole for connecting the gate line lead wire to the peripheral circuit.

Furthermore, the active layer thin film is a polysilicon thin film.

Furthermore, a whole of the active layer thin film is an ion-doped region and the active layer thin film in the channel region is counter doped.

A structure of the array substrate will be detailed hereinafter in combination with FIG. 9 by taking as an example that the array substrate is a P-Si TFT array substrate, and the structure of the array substrate provided by the present embodiment is applicable to a P-Si TFT array substrate while it is not limited to this, for example, in a condition that the array substrate is an amorphous silicon TFT array substrate, the active layer is an a-Si layer, and does not have an ion doped region or a counter doped region, and a crystallization process, a doping process and a annealing process can not be needed.

As shown in FIG. 9, on the base substrate 10, there are the gate electrode pattern 101, the gate insulating layer pattern 21 is above the gate electrode pattern, the P-Si layer thin film 30 is above the gate insulating layer pattern, the pixel electrode pattern 104 is above the P-Si layer thin film 30, the source pattern 102 and the drain pattern 103 are above the pixel electrode pattern 104, and the channel region is located between the source pattern 102 and the drain pattern 103.

Furthermore, the passivation layer pattern 71 can also be formed above the source pattern 102, the drain pattern 103 and the channel region.

Herein, the pixel electrode pattern 104, the source pattern 102, the drain pattern 103 and the channel region pattern can be formed through one patterning process, and then simplifying the process and lowering the fabrication cost.

Exemplarily, the base substrate 10 is usually a glass substrate or a quartz substrate, and comprises a display region AA and a lead wire region NA, wherein, the display region comprises a source predetermined region 202, a drain predetermined region 203, a channel predetermined region 201 and a pixel electrode predetermined region 204, and the lead wire region comprises a lead wire predetermined region 205.

The gate electrode pattern 101 is located above the channel predetermined region 201 on the base substrate, and a gate line lead wire 105 is also formed at the same layer with the gate electrode pattern 101. The gate electrode pattern 101 and the gate line lead wire 105 can be formed from a W layer, a Cr layer or other conductive metal layer thin film.

The gate insulating layer pattern 21 is formed above the gate electrode pattern 101 and has a connecting through hole 106 formed therein at the lead wire predetermined region 205. The gate insulating layer pattern 21 can be formed of a dielectric layer thin film, wherein, the dielectric layer thin film can be a silicon nitride dielectric layer thin film, a silicon oxide dielectric layer thin film or a composite dielectric layer thin film of silicon nitride and silicon oxide.

The P-Si layer thin film 30 is located above the pixel electrode predetermined region 204, the source predetermined region 202, the drain predetermined region 203 and the channel predetermined region 201, and meanwhile, the P-Si layer thin film also covers the connecting through hole 106 formed at the lead wire predetermined region 205 to form the first connecting electrode 105a.

The P-Si layer thin film 30 can be formed through the following process: an a-Si layer thin film (not shown in the drawing) is deposited on the gate insulating layer pattern 21, and then is transformed to a P-Si layer thin film 30 (p-Si layer) through process methods such as an excimer laser annealing (ELA), a metal induced crystallization (MIC) or a solid phase crystallization (SPC). Exemplarily, a description is made by taking as an example that the a-Si layer thin film is transformed to the P-Si layer thin film 30 through the ELA. During the ELA, the a-Si layer thin film is quickly fused and re-crystallized by absorbing a far ultraviolet laser, so that the base substrate 10 can be kept in low temperature state and thus, is not affected. During a practical process, various parameters in a process of depositing the a-Si layer thin film need to be controlled strictly, for example, a hydrogen content of the a-Si layer thin film may be lowered through a hydrogenation treatment, so as to form the a-Si layer thin film with low hydrogen content, high uniformity of film thickness and low surface roughness.

Secondly, after forming the P-Si layer thin film 30, an ion doping is performed to the whole P-Si layer thin film 30, and exemplarily, a P type doping or a N type doping can be performed to the whole P-Si layer thin film 30. Correspondingly, after the pixel electrode pattern 104, the source pattern 102, the drain pattern 103 and the channel region pattern are subsequently formed, a counter doping is performed to the channel region of the P-Si layer thin film 30 by using the source pattern 102 and the drain pattern 103 as barrier layers. Exemplarily, if the P type doping is performed to the whole P-Si layer thin film 30, the N type doping is performed to the channel region of the P-Si layer thin film 30, on the contrary, if the N type doping is performed to the whole P-Si layer thin film 30, the P type doping is performed to the channel region of the P-Si layer thin film 30, so as to form an MOS structure.

Finally, a high temperature annealing treatment can also be performed to the P-Si layer thin film 30 after the doping. The annealing treatment on the one hand serves to reform the crystal lattices of the P-Si and on the other hand to diffuse doped ions.

The pixel electrode pattern 104 is located above the pixel electrode predetermined region 204, and the pixel electrode layer thin film 104a above the source predetermined region 202, the pixel electrode layer thin film 104b above the drain predetermined region 203 and the second connecting electrode 105b formed above the lead wire predetermined region 205 are also formed at the same layer. The pixel electrode pattern 104, the pixel electrode layer thin films 104a, 104b and the third connecting electrode 105c are formed of a transparent conductive material, for example, indium tin oxide.

The source pattern 102 is located above the source predetermined region 202, the drain pattern 103 is located above the drain predetermined region 203, and the third connecting electrode 105c formed above the lead wire predetermined region 205 is also formed at the same layer with the source pattern 102 and the drain pattern 103; the source pattern 102, the drain pattern 103 and the third connecting electrode 105c can be formed of a W layer, a Cr layer or other conductive metal layer.

The passivation layer pattern 71 is located above the source predetermined region 202, the drain predetermined region 203 and the channel predetermined region 201. In addition, the passivation layer pattern 71 can also cover an edge of the pixel electrode pattern 104 at the pixel electrode predetermined region 204, and when the array substrate is used for an OLED, it can prevent the pixel electrode pattern 104 from piercing an organic layer, in turn, a short circuit of cathode and anode caused by the piercing can be avoided, and the passivation layer pattern 71 has a function of a protective layer (i.e., a PDL layer) in a traditional 7-Mask process. A material forming the passivation layer pattern 71 can be an inorganic material, an organic material, or a mixture of an inorganic material and an organic material.

It needs to be indicated that, as shown in FIG. 9, at the lead wire predetermined region, the first connecting electrode 105a, the second connecting electrode 105b and the third connecting electrode 105c are connected with the gate line lead wire 105 through the connecting through hole 106 in the gate insulating layer pattern 21. The passivation layer pattern 71 also covers the third connecting electrode 105c in the lead wire predetermined region 205, and is formed with a through hole (not shown in the drawing) for connection with the peripheral circuit. Correspondingly, in a region where the data line is connected with the peripheral circuit, the passivation layer pattern 71 is also formed with a through hole (not shown in the drawing).

It needs to be indicated that the array substrate according to the present embodiment is described by taking a bottom gate type TFT array substrate as an example and is manufactured by using the manufacturing method according to the first embodiment of the present invention, wherein, the pixel electrode pattern the source pattern, the drain pattern and the active layer pattern are formed with one patterning process, and but, because a forming order of various structure layers is not limited in the first embodiment of the present invention, a structure of the array substrate in the present embodiment can be changed depending on the manufacturing method, for example, the array substrate of the present embodiment can also be a top gate type TFT array substrate, and correspondingly an arrangement order of various layers, patterns and lead wire regions can be adjusted adaptively, and such variations shall also fall within the protection scope of the embodiment of the present invention.

The array substrate in this embodiment can be fabricated with the manufacturing method according to the first embodiment, the pixel electrode pattern, the source pattern, the drain pattern and the active layer pattern are formed using one patterning process, and thus, the production process is simplified, the product cost is lowered and the quality is improved.

A Third Embodiment

The present embodiment provides a display device comprising the array substrate according to the second embodiment and a counter substrate cell-assembled with the array substrate, as the array substrate has advantages of low cost, high quality and the like, the cost of the display device can be lowered and the quality of the display device can be improved.

For the array substrate, the manufacturing method thereof and the display device provided by the embodiments of the present invention, the source pattern, the drain pattern, the pixel electrode pattern and the active layer pattern are formed by using one patterning process, the number of the patterning processes can be reduced, and compared with the traditional 7-Mask fabrication process, the production process is simplified, the production period of the array substrate is shortened, the product cost is lowered and the product quality is improved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A manufacturing method of an array substrate for an LTPS TFT, comprising:
    preparing a base substrate;
    forming a gate electrode pattern on the base substrate;
    forming a gate insulating layer pattern on the base substrate with the gate electrode pattern formed thereon; and
    forming an active layer pattern, a pixel electrode pattern and source and drain patterns above the gate insulating layer pattern through a three-gray-tone mask process in one patterning process,
    wherein the gate electrode pattern, the active layer pattern, the source pattern and the drain pattern constitute a thin film transistor, and
    forming the active layer pattern, the pixel electrode pattern and the source and drain patterns above the gate insulating layer pattern through the three-gray-tone mask process in the one patterning process comprises:
    sequentially forming an active layer thin film, a pixel electrode layer thin film and a source/drain metal layer thin film, wherein, the active layer thin film comprises a source region corresponding to the source pattern, a drain region corresponding to the drain pattern, and a channel region used to form a channel of the thin film transistor;
    forming a photoresist with a first thickness, a second thickness and a third thickness above the source/drain metal layer thin film by using the three-gray-tone mask process, the photoresist with the first thickness being located above the channel region, the photoresist with the second thickness being located above a region where the pixel electrode pattern is located, and the photoresist with the third thickness being located above the source region and the drain region, wherein, the first thickness is smaller than the second thickness, and the second thickness is smaller than the third thickness; and
    etching away the active layer thin film, the pixel electrode layer thin film and the source/drain metal layer thin film in a region without the photoresist to form the active layer pattern, etching away the pixel electrode layer thin film and the source/drain metal layer thin film above the channel region to form the channel region, etching away the source/drain metal layer thin film in a region where the photoresist with the second thickness is located to form the pixel electrode pattern, and removing the photoresist above the source region and the drain region to form the source pattern and the drain pattern.

2. The manufacturing method of the array substrate for the LTPS TFT according to claim 1, wherein, the photoresist with the first, the second and the third thicknesses are formed by exposing using the three-gray-tone mask.

3. The manufacturing method of the array substrate for the LTPS TFT according to claim 1, further comprising:
    forming a passivation layer pattern on the base substrate with the thin film transistor and the pixel electrode pattern formed thereon.

4. The manufacturing method of the array substrate for the LTPS TFT according to claim 1, wherein, the active layer thin film is a polysilicon thin film.

5. The manufacturing method of the array substrate for the LTPS TFT according to claim 4, further comprising: performing an ion doping to the entire active layer thin film after forming the active layer thin film.

6. The manufacturing method of the array substrate for the LTPS TFT according to claim 5, after forming the source pattern and the drain pattern, further comprising: performing a counter doping to the channel region of the active layer thin film by using the source pattern and the drain pattern as a barrier layer.

7. The manufacturing method of the array substrate for the LTPS TFT according to claim 6, further comprising:
    forming a passivation layer thin film on the base substrate on which the source pattern and the drain pattern are formed and patterning the passivation layer thin film to form a passivation layer pattern; and
    annealing the active layer thin film after forming the passivation layer thin film and before patterning the passivation layer thin film.

8. The manufacturing method of the array substrate for the LTPS TFT according to claim 1, wherein, at the same time of etching away the active layer thin film, the pixel electrode layer thin film and the source/drain metal layer thin film in the region without the photoresist to form the active layer pattern, the photoresist with the first thickness above the channel region is simultaneously removed.

9. The manufacturing method of the array substrate for the LTPS TFT according to claim 1, wherein, at the same time of etching away the pixel electrode layer thin film and the source/drain metal layer thin film above the channel region to form the channel region, the photoresist with the second thickness is simultaneously removed.

* * * * *